(12) United States Patent
Motz

(10) Patent No.: US 10,969,444 B2
(45) Date of Patent: Apr. 6, 2021

(54) CONCEPT FOR COMPENSATING FOR A MECHANICAL STRESS OF A HALL SENSOR CIRCUIT INTEGRATED INTO A SEMICONDUCTOR SUBSTRATE

(71) Applicant: Infineon Technologies AG, Neubiberg (DE)

(72) Inventor: Mario Motz, Wernberg (AT)

(73) Assignee: Infineon Technologies AG, Neubiberg (DE)

(*) Notice: Subject to any disclaimer, the term of this patent is extended or adjusted under 35 U.S.C. 154(b) by 44 days.

(21) Appl. No.: 16/395,644

(22) Filed: Apr. 26, 2019

(65) Prior Publication Data

US 2019/0353717 A1 Nov. 21, 2019

(30) Foreign Application Priority Data

May 16, 2018 (DE) .......................... 102018111753.1

(51) Int. Cl.
*G01R 33/00* (2006.01)
*G01R 33/07* (2006.01)
(Continued)

(52) U.S. Cl.
CPC ......... *G01R 33/0082* (2013.01); *G01R 33/07* (2013.01); *H01L 43/065* (2013.01); *H01L 43/14* (2013.01)

(58) Field of Classification Search
None
See application file for complete search history.

(56) References Cited

U.S. PATENT DOCUMENTS 5,818,225 A 10/1998 Miekley et al.
2009/0108839 A1* 4/2009 Ausserlechner ........ H01L 27/22
324/251

(Continued)

FOREIGN PATENT DOCUMENTS

CH 691411 A5 7/2001
CN 203550968 U 4/2014
(Continued)

*Primary Examiner* — Jas A Sanghera
(74) *Attorney, Agent, or Firm* — Harrity & Harrity, LLP

(57) ABSTRACT

The present disclosure describes a semiconductor circuit arrangement comprising a Hall sensor circuit integrated into a semiconductor substrate and configured to conduct a Hall supply current between a first terminal and a second terminal of a Hall effect region at an angle of 45° with respect to a normal to a primary flat plane of the semiconductor substrate laterally through the Hall effect region, wherein the Hall supply current has a first dependence on a mechanical stress of the semiconductor substrate. A resistance arrangement integrated into the semiconductor substrate, the resistance arrangement being different than the Hall effect region, is configured to conduct a current between a first terminal and a second terminal of the resistance arrangement, wherein the current through the resistance arrangement has a second dependence on the mechanical stress of the semiconductor substrate. A compensation circuit is configured to correct, on the basis of a signal difference between the first terminal of the Hall effect region and the first terminal of the resistance arrangement, a Hall voltage that is measured between a third and a fourth terminal of the Hall effect region and is dependent on the mechanical stress of the semiconductor substrate.

20 Claims, 5 Drawing Sheets

(51) Int. Cl.
*H01L 43/14* (2006.01)
*H01L 43/06* (2006.01)

(56) References Cited

U.S. PATENT DOCUMENTS

2017/0261567 A1 9/2017 Cesaretti
2017/0331429 A1 11/2017 Motz

FOREIGN PATENT DOCUMENTS

| | | |
|---|---|---|
| CN | 104048692 A | 9/2014 |
| CN | 105897166 A | 8/2016 |
| CN | 105910735 A | 8/2016 |
| CN | 106716164 A | 5/2017 |
| CN | 107356269 A | 11/2017 |
| DE | 2844420 A1 | 4/1980 |
| DE | 102005008724 A1 | 9/2006 |
| DE | 102013106913 A1 | 1/2014 |
| DE | 102014103556 A1 | 9/2014 |
| DE | 102013106913 B4 | 11/2015 |
| DE | 102015103075 B4 | 8/2016 |
| JP | 63293986 A | 11/1988 |

\* cited by examiner

CONCEPT FOR COMPENSATING FOR A MECHANICAL STRESS OF A HALL SENSOR CIRCUIT INTEGRATED INTO A SEMICONDUCTOR SUBSTRATE

RELATED APPLICATION

This application claims priority under 35 U.S.C. § 119 to German Patent Application No. 102018111753.1, filed on May 16, 2018, the contents of which are incorporated by reference herein in their entirety.

TECHNICAL FIELD

Example implementations of the present disclosure relate to integrated circuit arrangements in a semiconductor substrate and, for example, to a concept to compensate for the negative influence of a mechanical stress component in the semiconductor substrate on the parameter accuracy and parameter stability of the circuit arrangement integrated in the semiconductor substrate.

BACKGROUND

Integrated circuit arrangements or integrated circuits (ICs) are usually mounted in packages in order to protect the sensitive integrated circuit arrangements against environmental influences. In this case, however, an unpleasant side effect that can be observed is that even the accommodation and mounting of the integrated circuit arrangement in a package can exert a considerable mechanical stress on the semiconductor material and thus on the semiconductor substrate of the integrated circuit arrangement. This applies in particular to low-cost package shapes configured as mass-produced articles, such as, for example, to those package shapes in which a potting compound is injection molded around the integrated circuit arrangement. The potting compound then cures by virtue of the potting compound cooling to ambient temperature proceeding from a temperature of approximately 150° C.-185° C. Since the semiconductor material of the integrated circuit arrangement and the plastic potting material of the package surrounding the integrated circuit arrangement do not have matching coefficients of thermal expansion, upon cooling to ambient temperature, for example room temperature, the plastic material contracts to a greater extent and exerts a substantially non-reproducible mechanical stress on the semiconductor material of the integrated circuit arrangement. The plastic material generally has a higher coefficient of thermal expansion than the semiconductor material of the integrated circuit arrangement, wherein silicon or else germanium, gallium arsenide (GaAs), InSb, InP, etc. can usually be used as semiconductor materials.

The mechanical stress in the semiconductor material of the semiconductor substrate which acts on the integrated circuit arrangement can be reproduced poorly in general because the mechanical stress is dependent on the combination of the materials used for the semiconductor substrate and the for the potting compound and moreover on the processing parameters, such as, for example, the curing temperature and curing time duration of the potting compound of the package of the integrated circuit arrangement.

As a result of various piezo effects in the semiconductor material, such as, for example, as a result of the piezoresistive effect, piezo MOS effect, piezo junction effect, piezo Hall effect and piezo tunnel effect, important electrical and/or electronic parameters of the integrated circuit arrangement are also influenced by an acting mechanical stress of the integrated circuit arrangement. In this case, in the context of the further description, the generic term "piezo effects" generally denotes the changes in electrical and/or electronic parameters of the circuit arrangement integrated in the semiconductor material under the influence of a mechanical stress in the semiconductor material.

A mechanical stress in the semiconductor material causes a change in the properties of the charge carriers with regard to charge carrier transport, such as, for example, mobility, collision time, leakage factor, Hall constant, etc.

To put it generally, the piezoresistive effect specifies how the specific ohmic resistance of the respective semiconductor material behaves under the influence of a mechanical stress. The piezo junction effect results, inter alia, in changes in the characteristic curves of diodes and bipolar transistors. The piezo Hall effect describes the dependence of the Hall constant of the semiconductor material on the mechanical stress state in the semiconductor material. The piezo tunnel effect occurs at reverse-biased, highly doped, shallow lateral p-n junctions. This current is dominated by band-to-band tunnel effects and is likewise stress-dependent. The piezoresistive effect and the expression "piezo MOS effect", which may occasionally be found in the literature, can be classified in a comparable way since in the case of the piezo MOS effect essentially just like in the case of the piezoresistive effect, the mobility of the charge carriers in the MOS channel of a MOS field effect transistor changes under the influence of the mechanical stress in the semiconductor material of the integrated circuit chip.

Thus, on account of mechanical stresses in the semiconductor material of an integrated circuit arrangement, the electrical and/or electronic characteristics of the integrated circuit arrangement can be unpredictably altered or impaired, wherein a decrease in the performance (or parameters) of the integrated circuit arrangement for example in the form of an impairment of the modulation range, the resolution, the bandwidth, the current consumption or the accuracy, etc. may be observed.

Specifically, the piezoresistive effect discussed above specifies how the specific ohmic resistance of the respective semiconductor material behaves under the influence of a mechanical stress tensor and the piezoresistive coefficient. In integrated circuit arrangements (ICs), the respective current I, for example a control current, a reference current, etc., is generated through circuit elements of the integrated circuit arrangement on the semiconductor chip. In this case, essentially a defined voltage U is generated at an integrated resistance having the resistance value R and the current I is coupled out. The current I can thus generally be generated at any resistive element, for example also at a MOS field effect transistor that is in the linear operating region.

As a result of known bandgap principles, for example, the voltage U can be generated in a relatively constant manner in regard to mechanical stresses in the semiconductor material (apart from the comparatively small piezo junction effect on the bandgap voltage generated). However, the resistance value R is subject to the piezoresistive effect. Since mechanical stresses in the semiconductor material as a result of the package of the integrated circuit arrangement actually affect the semiconductor circuit chip in a poorly controllable manner, the resistance value R for generating the current I and thus also the generated current I are altered in an undesired and unpredictable manner.

The piezo Hall effect, by contrast, describes then the dependence of the Hall constant on the mechanical stress state in the semiconductor material. Both the piezoresistive effect and the piezo Hall effect can be extremely disturbing during the operation of an integrated circuit arrangement, in particular of a sensor arrangement, such as, for example, an integrated Hall sensor including drive and evaluation electronics.

As a result of the piezo Hall effect, which also occurs on account of mechanical stresses in the semiconductor material of the semiconductor chip of the integrated circuit arrangement, in the case of a Hall sensor arrangement, for example, the current-related sensitivity $S_{i,Hall}$ of the Hall sensor changes. Moreover, owing to the piezoresistive effect, given the presence of mechanical stresses in the semiconductor material of the Hall sensor arrangement, the Hall supply current through the Hall sensor changes since the Hall supply current (control current) is defined for example only by way of a concomitantly integrated resistance $R_{Hall}$, across which a voltage U can be dropped, possibly by means of a control loop. A change in the Hall current on account of a resistance change $\delta R_{Hall}$ owing to the piezoresistive effect therefore leads to a change in the sensitivity $S_{i,Hall}$ of the Hall sensor.

The magnetic sensitivity of the Hall sensor $S_{i,Hall}$ can be defined (as specified above) as the ratio of the overvoltage $U_{Hall}$ of the Hall sensor to the acting magnetic field component V. A mechanical stress in the semiconductor material of the Hall sensor arrangement thus influences the current-related magnetic sensitivity $S_{i,Hall}$ of a Hall sensor. It is generally endeavored to keep the magnetic sensitivity $S_{i,Hall}$ of a Hall sensor as constant as possible, wherein in particular influences on account of mechanical stresses are disturbing on account of the piezoresistive effects and piezo Hall effects explained above.

With regard to integrated Hall sensor circuit arrangements that generate a switching signal dependent on the acting magnetic field component B, it should be taken into consideration that the magnetic switching threshold $B_S$ can be reduced to the following form: $B_S \propto R_{Hall}/S_{i,Hall}$. It can thus generally be stated that the ratio of the current-related magnetic sensitivity $S_{i,Hall}$ to a resistance value $R_{Hall}$ is a determining factor for the magnetic parameters, such as, for example, sensitivity or switching thresholds, of a Hall sensor arrangement.

Mechanical stresses in the semiconductor material of an integrated circuit arrangement can thus ultimately have a disadvantageous effect on the magnetic sensitivity and/or the switching thresholds of an overall system established by a Hall sensor arrangement.

In practice, before the packaging process (i.e. at the wafer level) magnetic switching sensors can exhibit switching thresholds that differ by approximately 10% from those switching thresholds after accommodation in a package. This is caused by the piezo effects mentioned above. In this regard, in particular after accommodation in a package, it is possible to ascertain to that effect an undesired profile of the "magnetic switching threshold versus temperature" in the form of a hysteresis loop that opens between 1% and 4%, wherein this may be observed in particular if the IC package had absorbed a large amount of moisture before or during the packaging process and the residence duration of the semiconductor circuit chip at temperatures of above 100° C. is more than about 10 minutes (that is usually the diffusion time constant of small packages for integrated circuits). This is caused once again by the piezo effects mentioned above.

With regard to the piezo effects explained above, it should be taken into account that the coefficients defining the mechanical stresses occurring in the semiconductor material are "tensors", that is to say that the current-related magnetic sensitivity $S_{i,Hall}$ of a Hall element and the resistance value R of a resistive element vary not only as a result of the intensity of the mechanical stress in the semiconductor material but also as a result of the direction of the stress in the semiconductor material. The direction dependence of the mechanical stress in the semiconductor material holds true for the usually used {100} silicon material for p- and n-doped resistances $R^p$, $R^n$. Furthermore, it should be taken into account that {100} wafers and {001} wafers correspond to one another for reasons of symmetry in cubic crystals.

A brief explanation will now be given below of how endeavors to reduce the disturbing piezo influences above have been made using existing techniques. It is known that in the case of {100} silicon material the mechanical stress dependence of integrated resistance can be reduced by, if possible, using p-doped resistances instead of n-doped resistances because p-doped integrated resistances generally have lower piezo coefficients.

Furthermore, arrangements are known in which two resistances that are nominally equal in magnitude, in terms of the layout, are arranged perpendicular to one another and at a small distance from one another and are electrically connected in series or in parallel (so-called L layout). As a result, the total resistance becomes independent of the direction of the mechanical stress in the semiconductor material as much as possible and thus becomes reproducible as well as possible. At the same time, the piezo sensitivity of such an arrangement for an arbitrary direction of the mechanical stress also becomes minimally low.

Moreover, prior efforts have been made to fashion the IC package in such a way that the mechanical stress (the mechanical stresses) on the semiconductor circuit chip will become better reproducible. To that end, either more expensive ceramic packages are used or the mechanical parameters of the package components, i.e. semiconductor circuit chip, leadframe, potting compound, adhesive material or solder material, are coordinated with one another such that the influences of the various package components compensate for one another to the greatest possible extent or are at least as constant as possible in regard to mounting batch and stress loading of the integrated circuit arrangement during operation. It should become clear, however, that coordinating the mechanical parameters of the package components is extremely complex, and furthermore the tiniest changes in the process sequence lead once again to a variation of the influences of the various package components.

It becomes clear from the explanations above that an undesired and virtually uncontrollable influencing of the physical functional parameters of semiconductor components of integrated circuit arrangements on a semiconductor circuit chip on account of mechanical stresses in the semiconductor material can be brought about by various piezo effects. In this case, a compensation of the influence of the piezo effects on the physical and electronic functional parameters of the semiconductor components is problematic to the effect that the stress components occurring in the semiconductor material in general are not known in advance nor do they remain constant during the lifetime, with the result that the mechanical parameters when the integrated circuit arrangement is accommodated in a package, i.e. for example the material of the semiconductor chip, of the leadframe, of the potting compound, of the adhesive or of the solder material, can be coordinated with one another only with difficulty, or not at all, in order to suitably control the abovementioned piezo influences on the semiconductor material and thus on the electronic and physical functional parameters of the semiconductor components.

SUMMARY

There is a need for improved concepts for compensating for piezo influences on integrated circuit arrangements.

This need is taken into account by the devices and methods as claimed in the independent claims. Under some circumstances, example developments are the subject matter of the dependent claims.

In accordance with a first aspect, a semiconductor circuit arrangement is proposed. The semiconductor circuit arrangement comprises a semiconductor substrate. A Hall sensor circuit is integrated into the semiconductor substrate, the Hall sensor circuit being configured to conduct a Hall supply current between a first terminal and a second terminal of a Hall effect region at an angle of 45° with respect to a normal to a primary flat plane of the semiconductor substrate laterally through the Hall effect region. The Hall supply current has a first dependence on a mechanical stress of the semiconductor substrate. In addition, a resistance arrangement is integrated into the semiconductor substrate, the resistance arrangement being different than the Hall effect region and being configured to conduct a current between a first terminal and a second terminal of the resistance arrangement. The current through the resistance arrangement has a second dependence on the mechanical stress of the semiconductor substrate. The semiconductor circuit arrangement furthermore comprises a compensation circuit configured to correct, on the basis of a signal difference between the first terminal of the Hall effect region and the first terminal of the resistance arrangement, a Hall voltage that is measured between a third and a fourth terminal of the Hall effect region and is dependent on the mechanical stress of the semiconductor substrate.

In some example implementations, the resistance arrangement can be configured as a vertical resistance arrangement integrated into the semiconductor substrate in order to conduct a current between the first terminal and the second terminal of the resistance arrangement vertically through the semiconductor substrate.

In some example implementations, the compensation circuit can be configured to correct the Hall voltage multiplicatively on the basis of the signal difference.

In some example implementations, the semiconductor circuit arrangement can further comprise at least one variable current source configured to set the Hall supply current and/or the current through the resistance arrangement during a signal adjustment in such a way that the signal difference between the first terminal of the Hall effect region and the first terminal of the resistance arrangement is substantially zero.

In some example implementations, the Hall effect region and the resistance arrangement can have the same doping type.

In some example implementations, the Hall effect region and the resistance arrangement can be n-doped.

In some example implementations, the Hall effect region can be diffusion-shaped or implantation-shaped and the resistance arrangement can comprise at least one epitaxial resistance or one n-type well resistance.

In some example implementations, the semiconductor substrate can be a [100] semiconductor substrate and the Hall sensor circuit can be configured to conduct the Hall current between the first and second terminals of the Hall effect region in a [100], [010], [$\bar{1}$00] or [0$\bar{1}$0] direction laterally through the Hall effect region.

In some example implementations, the semiconductor substrate can be a silicon semiconductor substrate.

In accordance with a further aspect, a method for compensating for a mechanical stress of a Hall sensor circuit integrated into a semiconductor substrate is proposed. The method comprises generating a Hall supply current between a first and a second terminal of a Hall effect region at an angle of 45° with respect to a normal to a primary flat plane of the semiconductor substrate laterally through the Hall effect region. In this case, the Hall supply current has a first dependence on the mechanical stress of the semiconductor substrate. The method also comprises generating a current between a first and a second terminal of a resistance arrangement integrated into the semiconductor substrate, the resistance arrangement being different than the Hall effect region. The current through the resistance arrangement has a second dependence on the mechanical stress of the semiconductor substrate. The method additionally comprises correcting a Hall voltage that is measured between a third and a fourth terminal of the Hall effect region and is dependent on the mechanical stress of the semiconductor substrate on the basis of a signal difference between the first terminal of the Hall effect region and the first terminal of the resistance arrangement.

For the person skilled in the art it goes without saying that the angle of 45° is taken to mean corresponding angles in cubic crystals which depending on the crystal structure, under certain circumstances, can also deviate slightly (for example up to ±3°) from 45°.

BRIEF DESCRIPTION OF THE FIGURES

Some examples of devices and/or methods are explained in greater detail merely by way of example below with reference to the accompanying figures, in which.

DESCRIPTION

Figure 1A:
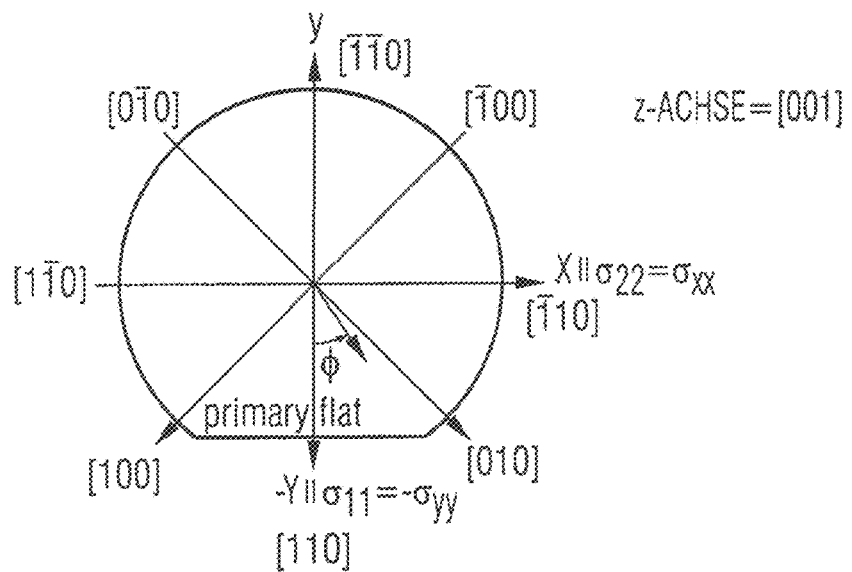
FIGS. 1A-1C show general definitions of crystallographic directions in the plane (wafer plane) of a semiconductor material.

Various examples will now be described more thoroughly with reference to the accompanying figures, in which some examples are illustrated. In the figures, the thicknesses of lines, layers and/or regions may be exaggerated for elucidation purposes.

While further examples are suitable for various modifications and alternative forms, some specific examples thereof are accordingly shown in the figures and described more thoroughly below. However, this detailed description does not limit further examples to the specific forms described. Further examples can cover all modifications, counterparts and alternatives that fall within the scope of the disclosure. Throughout the description of the figures, identical or similar reference signs refer to identical or similar elements which can be implemented identically or in modified form in a comparison with one another, while they provide the same or a similar function.

It goes without saying that if one element is designated as "connected" or "coupled" to another element, the elements can be connected or coupled directly or via one or more intermediate elements. If two elements A and B are combined using an "or", this should be understood such that all possible combinations are disclosed, i.e. only A, only B, and A and B, unless explicitly or implicitly defined otherwise. An alternative wording for the same combinations is "at least one from A and B", "at least one of A or B", or "A and/or B". The same applies, mutatis mutandis, to combinations of more than two elements.

The terminology used here for describing specific examples is not intended to be limiting for further examples. If a singular form, for example "a, an" and "the", is used and the use of only a single element is defined neither explicitly nor implicitly as obligatory further examples can also use plural elements in order the implement the same function. If a function is described below as being implemented using a plurality of elements, further examples can implement the same function using a single element or a single processing entity. Furthermore, it goes without saying that the terms "comprises", "comprising", "has" and/or "having" in their usage indicate with greater precision the presence of the specified features, integers, steps, operations, processes, elements, components and/or a group thereof, but do not exclude the presence or the addition of one or more other features, integers, steps, operations, processes, elements, components and/or a group thereof.

Unless defined otherwise, all terms (including technical and scientific terms) are used here in their customary meaning in the field with which examples are associated.

In order to simplify the understanding of the following detailed description of a semiconductor circuit arrangement for compensating for various piezo effects, the definitions used below regarding the semiconductor material used and the predefined directions on same with respect to the crystal orientation of the semiconductor material will now firstly be explained with reference to FIGS. 1A-1C.

For the production of integrated circuits, the semiconductor wafers, such as silicon wafers or silicon slices, for example, are sawn from a single-crystal rod in such a way that the wafer surface is assigned to a crystallographic plane. In order to define the respective plane in a cubic crystal, the so-called "Miller indices" are used here. FIG. 1A shows for example a plan view of a semiconductor wafer cut in the (100) plane.

Figure 1B:
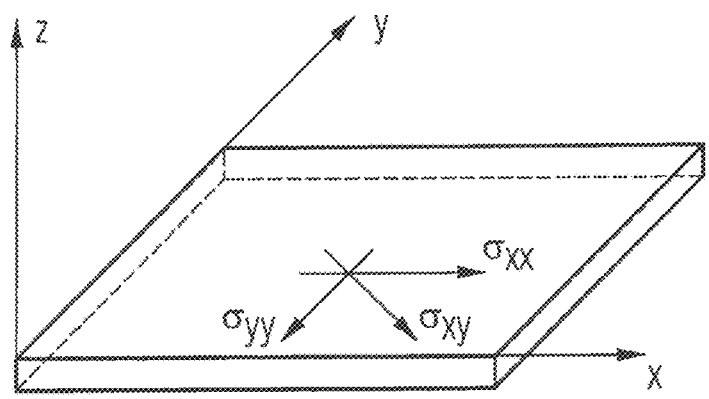
Figure 1C:
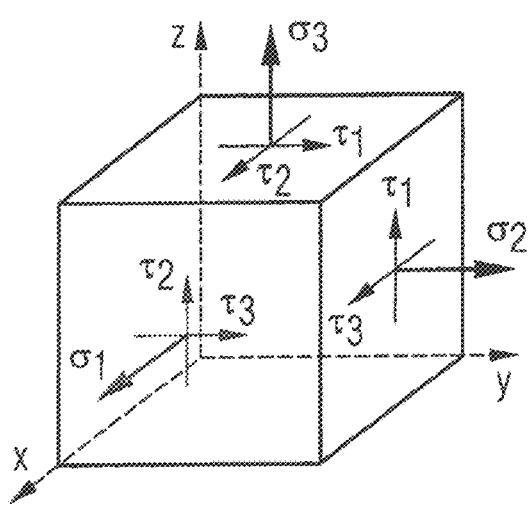

Furthermore, the principal crystallographic directions in the wafer plane are identified in FIGS. 1A-1C, wherein the manufacturers of silicon wafers often provide a so-called "Primary Flat" on the silicon slice. Equally, notches or the like can also be used for identification. Notches of this type are thus intended equally to be understood as a primary flat in the context of this disclosure. The edges of the rectangular geometries of the circuit structures on the semiconductor chip usually extend parallel or perpendicular to the primary flats. FIG. 1A illustrates in particular the crystallographic directions or axes in the plane of the semiconductor wafer, these being represented hereinafter in square brackets. The coordinate system is usually used in such a way that the [110] direction extends perpendicular or normal to the primary flat, while the [$\bar{1}$10] direction extends parallel to the primary flat. The directions [010] and [100] extend at an angle of +/−45° with respect to the [110] direction defining a normal to the primary flat plane. The directions [0$\bar{1}$0] and [$\bar{1}$00] extend at an angle of +/−45° with respect to the [$\bar{1}$ $\bar{1}$ 0] direction, which likewise defines a normal (in the opposite direction to [110]) to the primary flat plane.

Furthermore, an angle $\phi$, with respect to the [110] direction is defined, wherein the angle it, is counted in the counterclockwise direction proceeding from the [110] direction in a plan view of the wafer top side. The individual chips are usually positioned on the wafer such that the directions $\phi=0°$ and $\phi=90°$ correspond to the IC vertical and horizontal direction, respectively, wherein these directions can be interchanged depending on whether the IC is present in upright or horizontal form. Hereinafter, furthermore, the direction $\phi=90°$ is designated as the x-axis ([$\bar{1}$10] direction) and the direction $\phi=0°$ is designated as the negative y-axis ([110] direction).

Assuming that the x-axis is identical to the crystal direction [$\bar{1}$10], and the y-axis is identical to the [$\bar{1}$ $\bar{1}$ 0] crystal direction, this means in particular that the semiconductor circuit chip is fabricated from a {100} semiconductor material (for example {100} silicon). The primary flat is then usually parallel to the x-axis, such that the edges of the semiconductor circuit chip are parallel to the x- and y-axes. The crystal directions [100] and [010] are then identical to the diagonals of the semiconductor circuit chip (cf. FIG. 1B).

Since a {100} silicon material is used in the majority of applications for integrated semiconductor circuit arrangements, in order to simplify the explanations and on account of the particular practical importance, the following explanations relate primarily to the numerical values for {100} silicon material which are relevant to this material. It should be evident to the person skilled in the art, however, that other semiconductor materials or else other silica materials can also be used correspondingly.

A semiconductor circuit arrangement 20 for compensating for a mechanical stress of a Hall sensor circuit integrated into a semiconductor substrate will now be discussed below with reference to FIG. 2.

The schematically illustrated semiconductor circuit arrangement 20 comprises a Hall sensor circuit 21 integrated into the semiconductor substrate. The Hall sensor circuit 21 is configured to conduct, during a first clock interval PH1, a Hall supply current between a first terminal 22 and a second terminal 23 of a Hall effect region or Hall plate 24 at an angle of 90° with respect to a normal to a primary flat plane of the semiconductor substrate laterally through the Hall effect region 24 (that is to say for example in the direction [$\bar{1}$10]). In this case, during the first clock interval PH1, for example, a first voltage Vph1 is measured at the first terminal 22 of the Hall effect region 24 and is digitized by an analogue-to-digital converter (ADC) 27. For the [$\bar{1}$10] direction shown by way of example here as first current direction, by way of example for n-type diffusion resistances from the mechanical stress there arises a stress-direction-dependent resistance change of $$\delta R[\bar{1}10] = -31.2\sigma_{xx} - 17.6\sigma_{yy} + 53.4\sigma_{zz}.$$

The Hall sensor circuit 21 is configured to conduct, during a second clock interval PH2, the Hall supply current between a third terminal 25 and a fourth terminal 26 of the Hall effect region 24 at an angle of 0° with respect to the normal to the primary flat plane of the semiconductor substrate laterally through the Hall effect region 24 (that is to say for example in the [110] direction). In this case, during the second clock interval PH2, for example, a second Hall voltage Vph2 is measured at the first terminal 22 of the Hall effect region 24 and is digitized by the ADC 27. For the [110] direction shown here by way of example as the second current direction, by way of example for n-type diffusion resistances from the mechanical stress there arises a stress-direction-dependent resistance change of $$\delta R[110] = -17.6\sigma_{xx} - 31.2\sigma_{yy} + 53.4\sigma_{zz}.$$

It will be apparent to the person skilled in the art that the current directions of the two clock phases PH1 and PH2 could, of course, also be interchanged.

Figure 3:
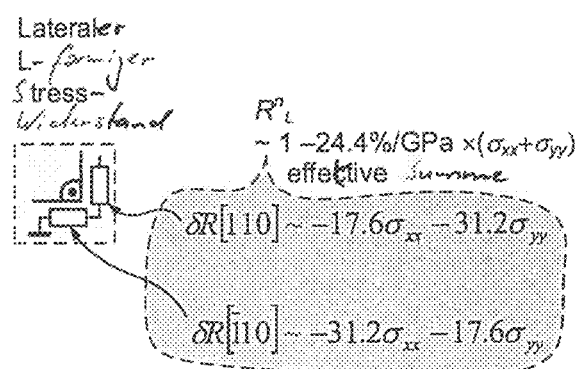
FIG. 3 shows an L resistance arrangement.

The direction dependence of piezoresistive effects can be eliminated by the semiconductor circuit arrangement 20 by virtue of the fact that the current flows through the Hall effect region 24 at an angle of 90° (or angle of 0°) with respect to the normal to the primary flat plane in the first clock interval PH1 and in a direction orthogonal thereto in the second clock interval, in order to carry out a temporal averaging of the two clock intervals. As a result of the two averaged clock intervals, the Hall effect region 24 behaves like two lateral orthogonal resistances in the so-called L layout (see FIG. 3), which, with regard to mechanical stress, behaves independently vis-à-vis a rotation of the entire arrangement by +/−45°. In an example {100} silicon semiconductor material, primarily the piezoresistive coefficients $\pi_{11}$, $\pi_{12}$ and the normal stress components $\sigma_{xx}$, $\sigma_{yy}$ in the plane of the chip surface are relevant to the piezoresistive effect. For n-doped resistances in the lateral L layout in accordance with FIG. 3, the following holds true: $\sigma R''_L = -24.4\%/\text{GPa} (\sigma_{xx} + \sigma_{yy})$.

The semiconductor circuit arrangement 20 furthermore comprises a resistance arrangement 28 integrated into the semiconductor substrate, the resistance arrangement being different than the Hall effect region 24 and being configured to conduct a current between a first terminal 29 and a second terminal 30 of the resistance arrangement 28. In this case, the resistance arrangement 28 has a different resistance change depending on the mechanical stress of the semiconductor substrate than the Hall effect region 24, such that a non-vanishing difference signal between the temporally averaged and thus direction-independent signal (for example voltage) of the Hall effect region 24 and the first terminal 29 of the resistance arrangement 28 results for given mechanical stress.

A compensation circuit (not illustrated) is configured to correct a Hall voltage measured at the Hall effect region 24, the Hall voltage being dependent on the mechanical stress of the semiconductor substrate, multiplicatively on the basis of the difference signal (between terminal 29 and the terminals 22, 25).

The example semiconductor circuit arrangement 20 comprises at least one variable current source 31 configured to set the two Hall supply currents of the clock intervals PH1 and PH2 during a signal adjustment (for example in the case of vanishing mechanical stress before the semiconductor circuit arrangement is packaged) in such a way that the respective signal difference between the first terminal 22 (or respectively the third terminal 25) of the Hall effect region 24 and the first terminal 29 of the resistance arrangement 28 is approximately zero. As a result of the resistance changes of the Hall effect region 24 and of the resistance arrangement 28 that are differently dependent on the mechanical stress, an (averaged) difference signal (for example difference voltage) then arises in the case of mechanical stress.

Figure 2:
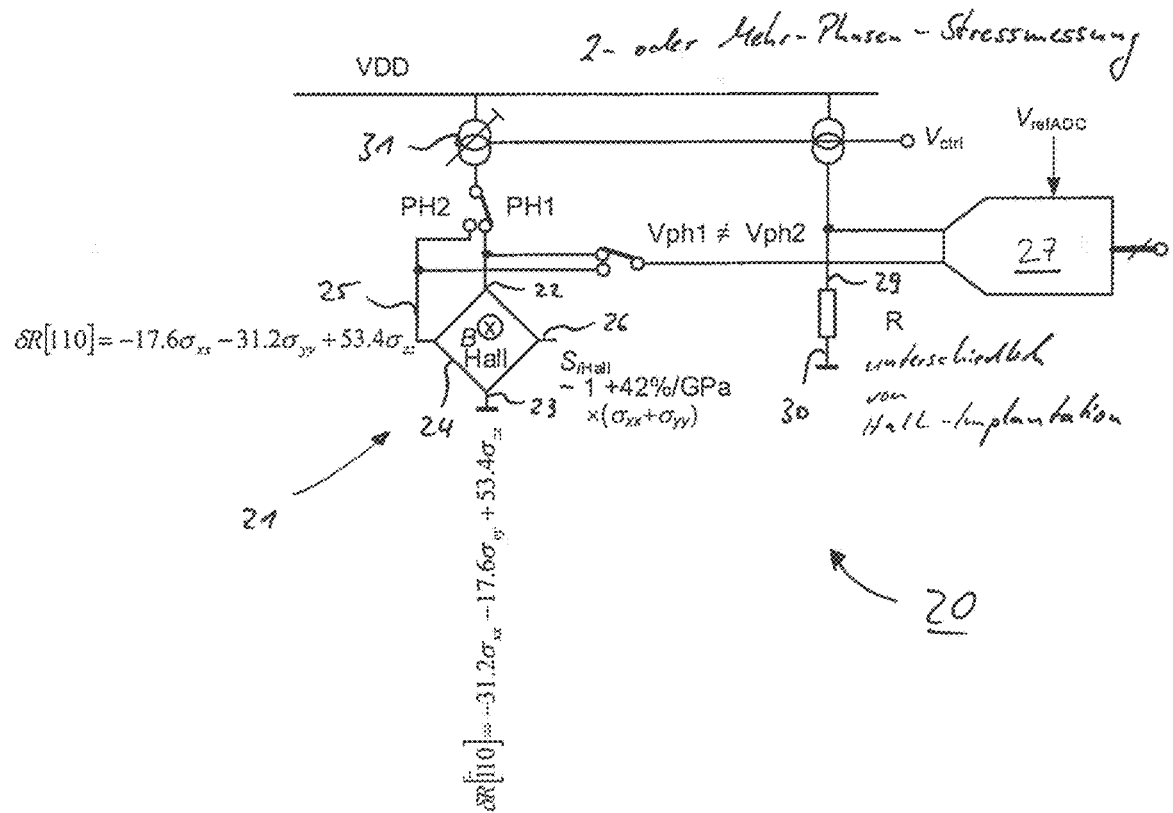
FIG. 2 shows a schematic illustration of a semiconductor circuit arrangement for compensating for a mechanical stress of a Hall sensor circuit integrated into a semiconductor substrate.

What is disadvantageous about the concept in FIG. 2 is the at least two clock intervals required to conduct the Hall supply current once at the angle of 90° and another time at the angle of 0° (or vice versa) with respect to the normal (in the [110] direction) to the primary flat plane laterally through the Hall effect region 24. That requires firstly more time and secondly also more hardware outlay (chip area).

Figure 4:
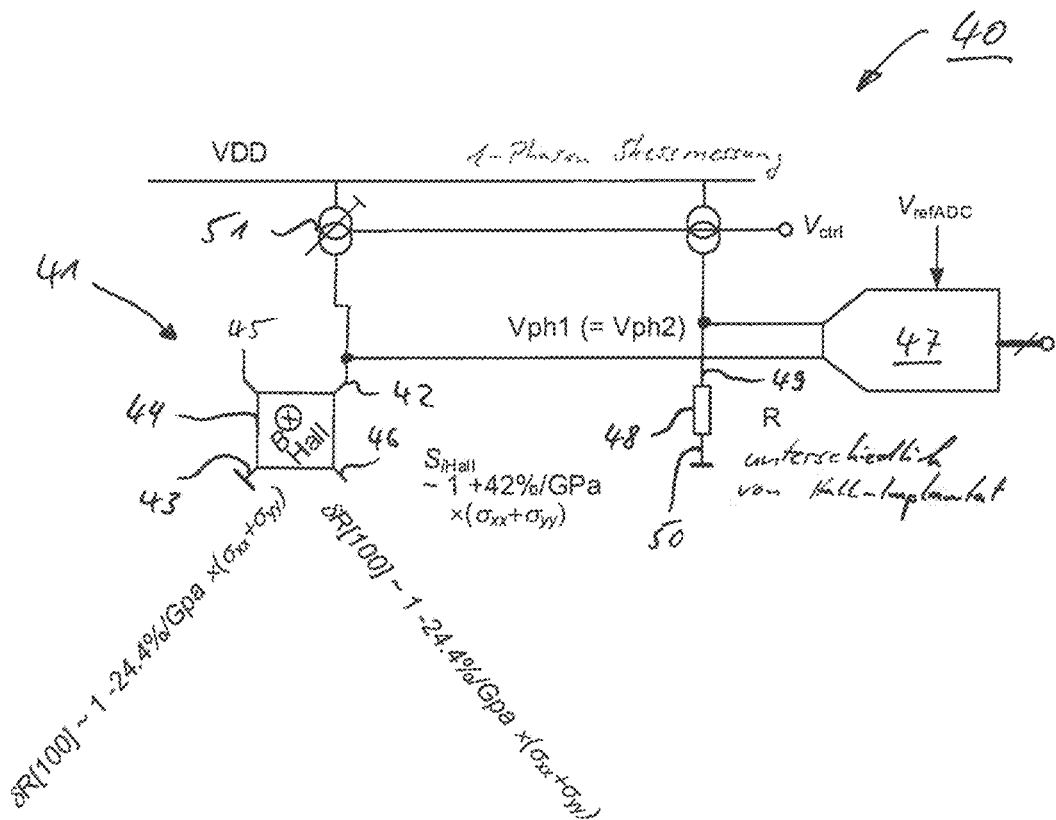
FIG. 4 shows a schematic illustration of a semiconductor circuit arrangement for compensating for a mechanical stress of a Hall sensor circuit integrated into a semiconductor substrate in accordance with one example implementation.

The present disclosure therefore proposes a concept which is improved by comparison therewith and which manages with just one clock interval and, if appropriate, with reduced hardware outlay. A corresponding semiconductor circuit arrangement 40 is shown schematically in FIG. 4.

In contrast to FIG. 2, the semiconductor circuit arrangement 40 comprises a Hall sensor circuit 41 integrated into the semiconductor substrate, the Hall sensor circuit being configured to conduct a Hall supply current between a first terminal 42 and a second terminal 43 of a Hall effect region 44 at an angle of 45° with respect to a normal to a primary flat plane of the semiconductor substrate laterally through the Hall effect region 44. As can be gathered from FIG. 1A, for an example {100} silicon semiconductor material, such angles of 45° correspond to the directions [100], [010], [1̄00] or [01̄0]. In this case, the Hall effect region 44 and thus the Hall supply current have a first dependence on a mechanical stress of the semiconductor substrate. For the directions [100], [010], [1̄00] or [01̄0] as Hall supply current direction, for n-type diffusion resistances largely direction-independently of the mechanical stress there arises a resistance change of $$\delta R''_{Hall}[010] = -24.4\sigma_{xx} - 24.4\sigma_{yy}, \text{ e.g.}$$

$$\delta R''_{Hall}[010] \sim 1-24.4\%/\text{GPa}*(\sigma_{xx}+\sigma_{yy}), \text{ (see FIG. 5)}$$

Figure 5:
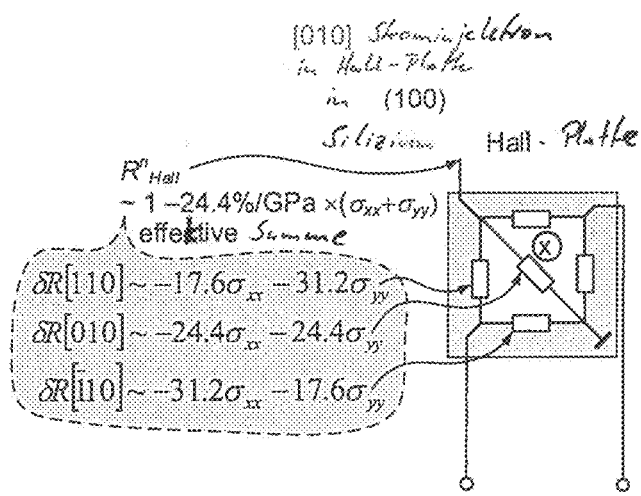
FIG. 5 shows a resistance equivalent circuit diagram of a Hall plate.

It has thus been recognized that in the case of a Hall supply current direction of substantially 45° with respect to the normal to the primary flat plane of the semiconductor substrate laterally through the Hall effect region, the resulting stress-dependent resistance change corresponds to that of the L resistance circuit comprising diffusion and/or implantation resistances, that is to say is independent of the direction of the mechanical stress. That is illustrated in FIG. 5.

Figure 6:
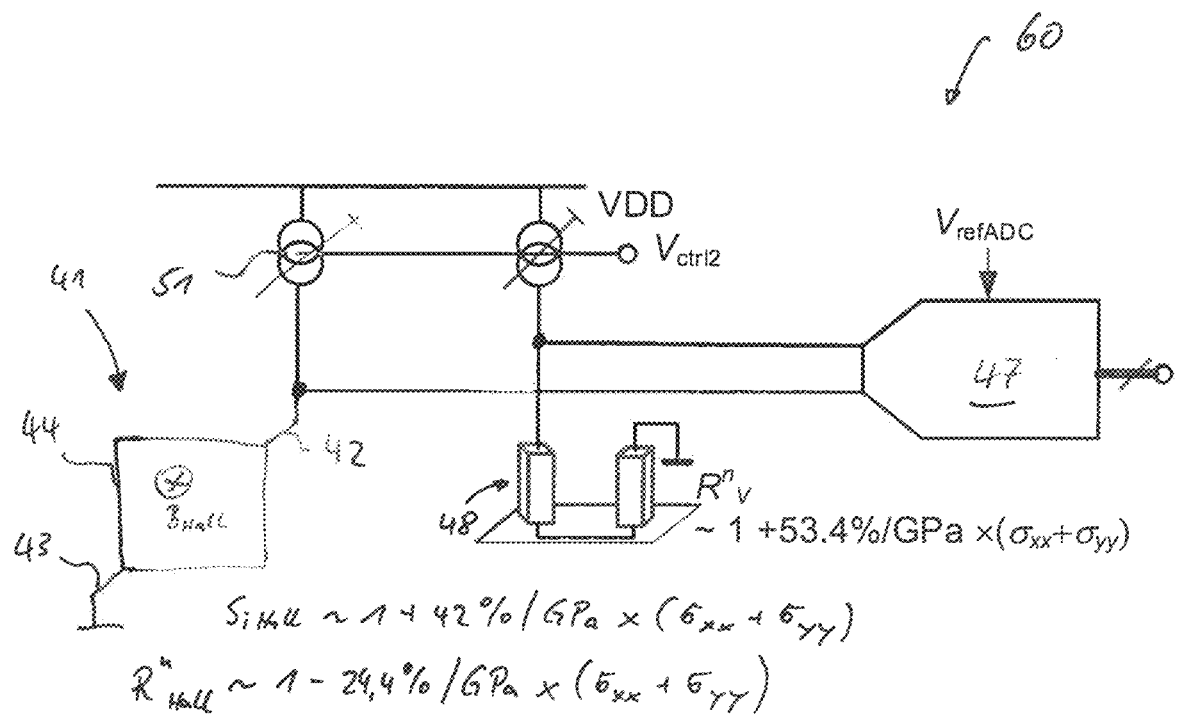
FIG. 6 shows a schematic illustration of a semiconductor circuit arrangement for compensating for a mechanical stress of a Hall sensor circuit integrated into a semiconductor substrate with a vertical resistance arrangement in accordance with one example implementation.

The semiconductor circuit arrangement 40 furthermore comprises a resistance arrangement 48 integrated into the semiconductor substrate, the resistance arrangement being different than the Hall effect region 44 and being configured to conduct a current between a first terminal 49 and a second terminal 50 (here: ground terminal) of the resistance arrangement 48. In this case, the resistance arrangement 48 and thus also the current through the resistance arrangement 48 have a second dependence on the mechanical stress of the semiconductor substrate. This second dependence can be achieved in various ways. By way of example, the resistance arrangement 48 can be doped differently in comparison with the Hall effect region 44. In one example, an n-doped Hall effect region 44 can be compared with a p-doped resistance arrangement 48. In another example, a lightly n-doped Hall effect region 44 can be compared with a highly doped n-type resistance 48. Alternatively, the Hall effect region 44 acting as a laterally acting resistance can be compared with at least one vertically acting resistance 48. In this case, the laterally acting resistance 44 substantially has a current flow parallel to the chip surface, and the vertically acting resistance 48 substantially has a current flow vertically with respect to the chip surface. One example of a vertically acting resistance $R''_v$, 48 is illustrated in FIGS. 6 and 7.

Figure 7:
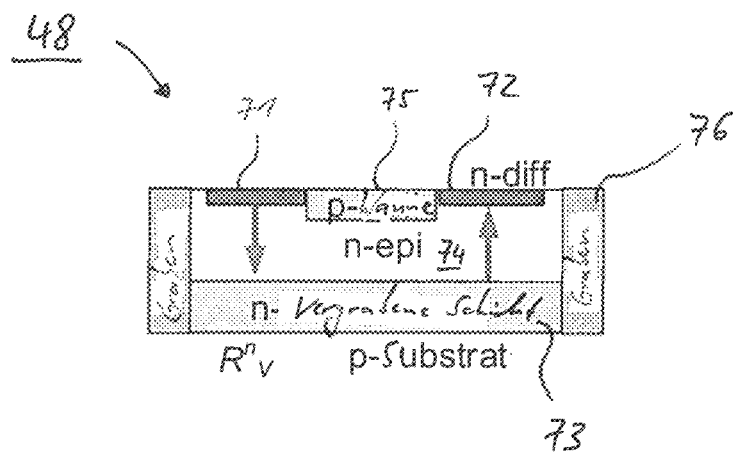
FIG. 7 shows a possible implementation of a vertical resistance arrangement.

FIG. 7 shows a schematic cross section of a vertical resistance $R''_v$. This is evident in FIG. 7, a principally vertical current flow occurs within the vertical resistance $R''_v$. The current is injected into the vertical resistance $R''_v$ at a contact 71 and extracted at a contact 72. On account of the presence of a conductive buried layer 73, the current traverses an n-type well (n-type well resistance) or an epitaxial region (epitaxial resistance) 74 substantially vertically until it reaches a buried layer 73. The current then flows substantially laterally toward the left within the buried layer 73 so as then to traverse the n-type well or epitaxial layer 74 once again substantially vertically until it reaches a contact 72. It should be noted that a resistance of the buried layer 73 is typically relatively low compared with the n-type well or epitaxial layer 74, such that a possible stress dependence of the buried layer 73 does not have a great influence on the instantaneous resistance of the vertical resistance $R''_v$. The buried layer can serve as an additional contact spaced apart vertically from the surface contacts 71, 72. A p-type well 75 is arranged at a surface of the n-type well or the epitaxial layer 74 between the contacts 71, 72. The vertical resistance $R''_v$ can be insulated from its surroundings by trenches 76.

A compensation circuit (not illustrated in the figures) of the semiconductor circuit arrangement 40 or 60 is configured to correct, on the basis of a signal difference between the first terminal 42 of the Hall effect region 44 and the first terminal 49 of the resistance arrangement 48, a Hall voltage measured between a third terminal 45 and a fourth terminal 46 of the Hall effect region 44, the Hall voltage being dependent on the mechanical stress of the semiconductor substrate. To that end, an ADC 47 is provided in order to digitize the signals of the first terminal 42 of the Hall effect region 44 and the first terminal 49 of the resistance arrangement 48 or the signal difference thereof and to send the outcome to a digital signal processing circuit, by which the Hall voltage can be corrected multiplicatively.

Here, too, the semiconductor circuit arrangement 40 can furthermore comprise at least one variable current source 51 configured to set the Hall supply current and/or the current through the resistance arrangement 48 during a signal adjustment in such a way that the signal difference (for example voltage difference) between the first terminal 42 of the Hall effect region and the first terminal 49 of the resistance arrangement is substantially zero. As a result of the resistance changes of the Hall effect region 44 and of the resistance arrangement 48 that are differently dependent on the mechanical stress, in the case of mechanical stress, a difference signal (for example difference voltage) then arises at the input of the ADC 47, by which the Hall voltage can then be corrected multiplicatively in a manner known per se.

Figure 8:
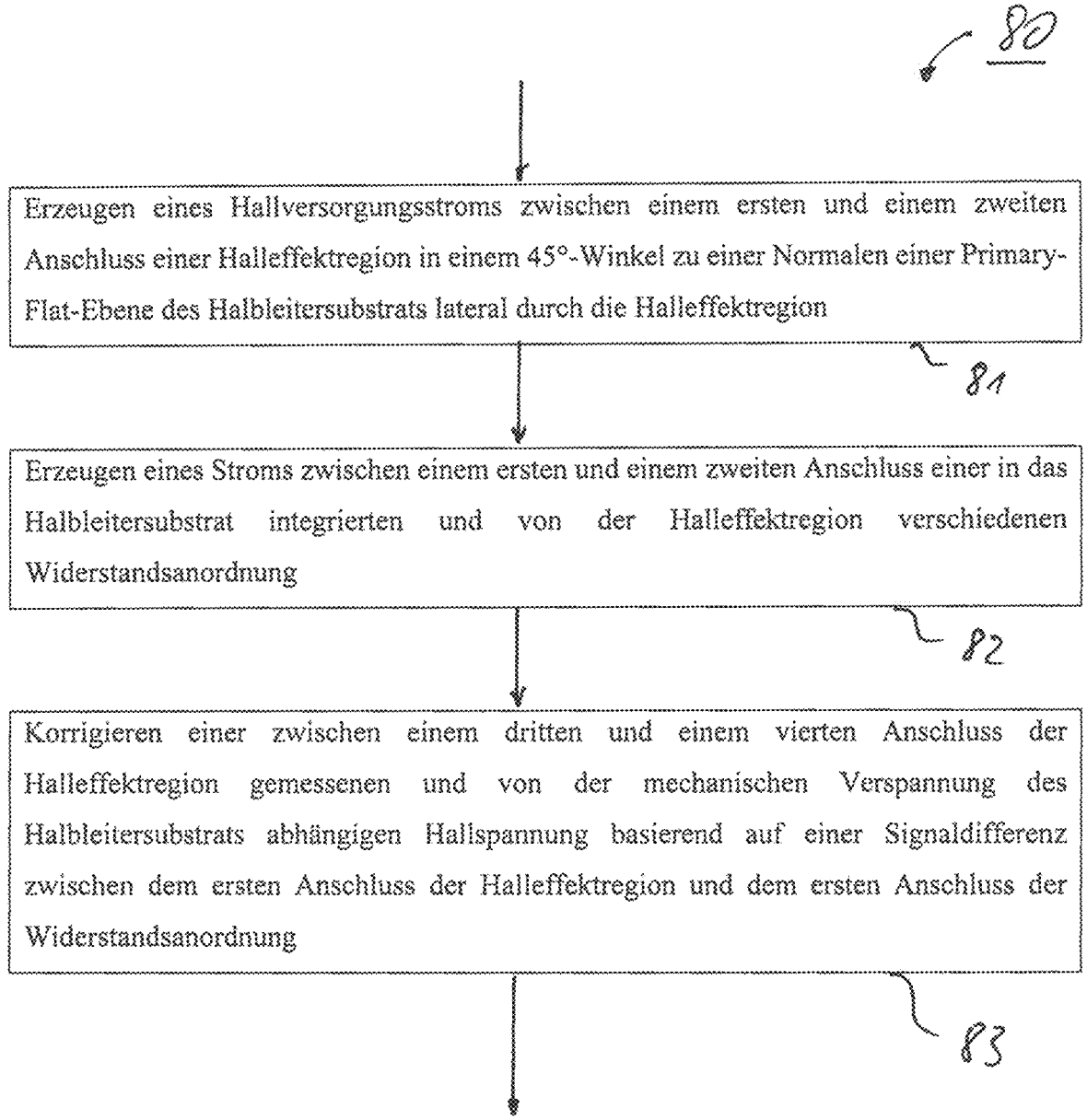
FIG. 8 shows a flow diagram of a method for compensating for a mechanical stress of a Hall sensor circuit integrated into a semiconductor substrate in accordance with one example implementation.

To summarize, the concept presented will be explained once again with reference to the flow diagram in FIG. 8.

The shown method 80 for compensating for a mechanical stress of a Hall sensor circuit integrated into a semiconductor substrate comprises generating 81 a Hall supply current between a first and a second terminal of a Hall effect region at an angle of 45° with respect to a normal to a primary flat plane of the semiconductor substrate laterally through the Hall effect region. In this case, the Hall supply current has a first dependence on the mechanical stress of the semiconductor substrate. The method furthermore comprises generating 82 a current between a first and a second terminal of a resistance arrangement integrated into the semiconductor substrate, the resistance arrangement being different than the Hall effect region. The current through the resistance arrangement has a second dependence on the mechanical stress of the semiconductor substrate. A step 83 involves correcting a Hall voltage measured between a third and a fourth terminal of the Hall effect region, the Hall voltage being dependent on the mechanical stress of the semiconductor substrate, on the basis of a signal difference between the first terminal of the Hall effect region and the first terminal of the resistance arrangement.

With the concept proposed, in which the Hall plate 44 is used both for magnetic field measurement and for stress measurement, just one clock interval or one spinning current phase is sufficient for stress compensation. In clock intervals that become free, the ADC 47 can thus be used for measuring other measurement values (for example for temperature compensation).

The aspects and features that have been described together with one or more of the examples and figures described in detail above can also be combined with one or more of the other examples in order to replace an identical feature of the other example or in order additionally to introduce the feature into the other example.

The description and drawings present only the principles of the disclosure. Furthermore, all examples mentioned here are intended to be used expressly only for illustrative purposes, in principle, in order to assist the reader in understanding the principles of the disclosure and the concepts contributed by the inventor(s) for further development of the art. All statements herein regarding principles, aspects and examples of the disclosure and also concrete examples thereof encompass the counterparts thereof.

A function block designated as "means for . . . " carrying out a specific function can relate to a circuit configured for carrying out a specific function. Consequently, a "means for something" can be implemented as a "means configured for or suitable for something", for example a component or a circuit configured for or suitable for the respective task.

Functions of different elements shown in the figures including those function blocks designated as "means", "means for providing a signal", "means for generating a signal", etc. can be implemented in the form of dedicated hardware, e.g. "a signal provider", "a signal processing unit", "a processor", "a controller" etc. and as hardware capable of executing software in conjunction with associated software. When provided by a processor, the functions can be provided by a single dedicated processor, by a single jointly used processor or by a plurality of individual processors, some or all of which can be used jointly. However, the term "processor" or "controller" is far from being limited to hardware capable exclusively of executing software, but rather can encompass digital signal processor hardware (DSP hardware), network processor application specific integrated circuit (ASIC), field programmable gate array (FPGA), read only memory (ROM) for storing software, random access memory (RAM) and nonvolatile memory device (storage). Other hardware, conventional and/or customized, can also be included.

A block diagram can illustrate for example a rough circuit diagram which implements the principles of the disclosure. In a similar manner, a flow diagram, a flow chart, a state transition diagram, a pseudo-code and the like can represent various processes, operations or steps which are represented for example substantially in a computer-readable medium and are thus performed by a computer or processor, regardless of whether such a computer or processor is explicitly shown. Methods disclosed in the description or in the patent claims can be implemented by a component having a means for performing each of the respective steps of the methods.

It goes without saying that the disclosure of a plurality of steps, processes, operations or functions disclosed in the description or the claims should not be interpreted as being in the specific order, unless this is explicitly or implicitly indicated otherwise, for example for technical reasons. The disclosure of a plurality of steps or functions therefore does not limit them to a specific order unless the steps or functions are not interchangeable for technical reasons. Furthermore, in some examples, an individual step, function, process or operation can include a plurality of partial steps, functions, processes or operations and/or be subdivided into them. Such partial steps can be included and be part of the disclosure of the individual step, provided that they are not explicitly excluded.

Furthermore, the claims that follow are hereby incorporated in the detailed description, where each claim can be representative of a separate example by itself. While each claim can be representative of a separate example by itself, it should be taken into consideration that—although a dependent claim can refer in the claims to a specific combination with one or more other claims—other examples can also encompass a combination of the dependent claim with the subject matter of any other dependent or independent claim. Such combinations are explicitly proposed here, provided that no indication is given that a specific combination is not intended. Furthermore, features of a claim are also intended to be included for any other independent claim, even if this claim is not made directly dependent on the independent claim.

What is claimed is:

1. A semiconductor circuit arrangement, comprising:
   a semiconductor substrate;
   a Hall sensor circuit integrated into the semiconductor substrate and configured to conduct a Hall supply current between a first terminal of a Hall effect region and a second terminal of the Hall effect region at an angle of 45° with respect to a normal to a primary flat plane of the semiconductor substrate laterally through the Hall effect region,
      wherein the Hall supply current has a first dependence on a mechanical stress of the semiconductor substrate;
   a resistance arrangement integrated into the semiconductor substrate,
      wherein the resistance arrangement is different than the Hall effect region and is configured to conduct a current between a first terminal of the resistance arrangement and a second terminal of the resistance arrangement,
         wherein the current between the first terminal of the resistance arrangement and the second terminal of the resistance arrangement has a second dependence on the mechanical stress of the semiconductor substrate; and
   a compensation circuit configured to correct, based on a signal difference between the first terminal of the Hall effect region and the first terminal of the resistance arrangement, a Hall voltage that is measured between a third terminal of the Hall effect region and a fourth terminal of the Hall effect region and is dependent on the mechanical stress of the semiconductor substrate.

2. The semiconductor circuit arrangement as claimed in claim 1, wherein the resistance arrangement is configured as a vertical resistance arrangement integrated into the semiconductor substrate to conduct the current between the first terminal of the resistance arrangement and the second terminal of the resistance arrangement vertically through the semiconductor substrate.

3. The semiconductor circuit arrangement as claimed in claim 1, wherein the compensation circuit is configured to correct the Hall voltage multiplicatively based on the signal difference.

4. The semiconductor circuit arrangement as claimed in claim 1, further comprising at least one variable current source configured to set the Hall supply current and/or the current between the first terminal of the resistance arrangement and the second terminal of the resistance arrangement during a signal adjustment in such a way that the signal difference between the first terminal of the Hall effect region and the first terminal of the resistance arrangement is zero.

5. The semiconductor circuit arrangement as claimed in claim 1, wherein the Hall effect region and the resistance arrangement have a same doping type.

6. The semiconductor circuit arrangement as claimed in claim 5, wherein the Hall effect region and the resistance arrangement are n-doped.

7. The semiconductor circuit arrangement as claimed in claim 1, wherein the Hall effect region is diffusion-shaped or implantation-shaped and the resistance arrangement comprises an epitaxial resistance or an n-type well resistance.

8. The semiconductor circuit arrangement as claimed in claim 1, wherein the semiconductor substrate is a {100} semiconductor substrate and the Hall sensor circuit is configured to conduct the Hall supply current between the first terminal of the Hall effect region and the second terminal of the Hall effect region in a [100], [010], [$\overline{1}$00], or [0$\overline{1}$0] direction laterally through the Hall effect region.

9. The semiconductor circuit arrangement as claimed in claim 1, wherein the semiconductor substrate is a silicon semiconductor substrate.

10. A method for compensating for a mechanical stress of a Hall sensor circuit integrated into a semiconductor substrate, the method comprising:
    conducting a Hall supply current between a first terminal of a Hall effect region and a second terminal of the Hall effect region at an angle of 45° with respect to a normal to a primary flat plane of the semiconductor substrate laterally through the Hall effect region,
       wherein the Hall supply current has a first dependence on a mechanical stress of the semiconductor substrate;
    conducting a current between a first terminal of a resistance arrangement integrated into the semiconductor substrate and a second terminal of the resistance arrangement,
       wherein the resistance arrangement is different than the Hall effect region, and
       wherein the current between the first terminal of the resistance arrangement and the second terminal of the resistance arrangement has a second dependence on the mechanical stress of the semiconductor substrate; and
    correcting a Hall voltage, that is measured between a third terminal of the Hall effect region and a fourth terminal of the Hall effect region and is dependent on the mechanical stress of the semiconductor substrate, based on a signal difference between the first terminal of the Hall effect region and the first terminal of the resistance arrangement.

11. The method as claimed in claim 10, wherein the resistance arrangement is configured as a vertical resistance arrangement integrated into the semiconductor substrate to conduct the current between the first terminal of the resistance arrangement and the second terminal of the resistance arrangement vertically through the semiconductor substrate.

12. The method as claimed in claim 10, wherein correcting the Hall voltage includes correcting the Hall voltage multiplicatively based on the signal difference.

13. The method as claimed in claim 10, further comprising setting the Hall supply current and/or the current between the first terminal of the resistance arrangement and the second terminal of the resistance arrangement during a signal adjustment in such a way that the signal difference between the first terminal of the Hall effect region and the first terminal of the resistance arrangement is zero.

14. The method as claimed in claim 10, wherein the Hall effect region and the resistance arrangement have a same doping type.

15. The method as claimed in claim 14, wherein the Hall effect region and the resistance arrangement are n-doped.

16. The method as claimed in claim 10, wherein the Hall effect region is diffusion-shaped or implantation-shaped and the resistance arrangement comprises an epitaxial resistance or an n-type well resistance.

17. The method as claimed in claim 10, wherein the semiconductor substrate is a {100} semiconductor substrate and the Hall sensor circuit is configured to conduct the Hall supply current between the first terminal of the Hall effect region and the second terminal of the Hall effect region in a [100], [010], [$\bar{1}$00], or [0$\bar{1}$0] direction laterally through the Hall effect region.

18. The method as claimed in claim 10, wherein the semiconductor substrate is a silicon semiconductor substrate.

19. A semiconductor circuit arrangement, comprising:
a semiconductor substrate;
a Hall sensor circuit integrated into the semiconductor substrate and configured to conduct a Hall supply current between a first terminal of a Hall effect region and a second terminal of the Hall effect region,
wherein the Hall supply current has a first dependence on a mechanical stress of the semiconductor substrate;
a resistance arrangement integrated into the semiconductor substrate,
wherein the resistance arrangement is different than the Hall effect region and is configured to conduct a current between a first terminal of the resistance arrangement and a second terminal of the resistance arrangement, and
wherein the current between the first terminal of the resistance arrangement and the second terminal of the resistance arrangement has a second dependence on the mechanical stress of the semiconductor substrate;
a compensation circuit configured to correct, based on a signal difference between the first terminal of the Hall effect region and the first terminal of the resistance arrangement, a Hall voltage that is measured between a third terminal of the Hall effect region and a fourth terminal of the Hall effect region and is dependent on the mechanical stress of the semiconductor substrate; and
at least one variable current source configured to set the Hall supply current or the current between the first terminal of the resistance arrangement and the second terminal of the resistance arrangement during a signal adjustment in such a way that the signal difference between the first terminal of the Hall effect region and the first terminal of the resistance arrangement is approximately zero.

20. The semiconductor circuit arrangement as claimed in claim 19, wherein the Hall effect region is doped differently than the resistance arrangement.

* * * * *